United States Patent [19]

Huber et al.

[11] Patent Number: 4,516,010
[45] Date of Patent: May 7, 1985

[54] METHOD OF MANUFACTURING A RADIATION RECEIVER

[75] Inventors: Hans P. Huber; Jochen Weber, both of Neu-Ulm, Fed. Rep. of Germany

[73] Assignee: Licentia Patent-Verwaltungs-GmbH, Fed. Rep. of Germany

[21] Appl. No.: 431,601

[22] Filed: Sep. 30, 1982

[30] Foreign Application Priority Data

Nov. 4, 1981 [DE] Fed. Rep. of Germany ....... 3143652

[51] Int. Cl.³ ............................................. B23K 27/00
[52] U.S. Cl. ................................ 219/121 LJ; 29/846; 219/121 LH
[58] Field of Search ................... 219/121 LJ, 121 LH, 219/121 EJ, 121 EK, 121 PD, 121 PE; 29/846, 841; 430/313, 318, 319, 945; 156/659.1, 656

[56] References Cited

U.S. PATENT DOCUMENTS

| 3,719,990 | 3/1973 | Long et al. ............................. 29/841 |
| 3,732,796 | 5/1973 | Marcy ...................................... 354/4 |
| 4,081,654 | 3/1978 | Miracek .......................... 219/121 LJ |
| 4,154,530 | 5/1979 | Connolly, Jr. et al. ... 219/121 LH X |
| 4,190,759 | 2/1980 | Hongo et al. ................. 219/121 LH |

FOREIGN PATENT DOCUMENTS 1583192 1/1981 United Kingdom .......... 219/121 EJ

OTHER PUBLICATIONS

Weick, *IEE Journal of Quantum Electronics*, "Laser Generation of Conductor Patterns", vol. QE 8, No. 2, pp. 126–131, Feb. 1972.

*Primary Examiner*—C. L. Albritton
*Attorney, Agent, or Firm*—McGlew and Tuttle

[57] ABSTRACT

The leads to sensor elements of a radiation receiver are embodied as conductor tracks which are produced by deflecting a laser beam and thus sectioning a large-surface metallic layer into a desired pattern of the tracks.

9 Claims, 3 Drawing Figures 4,516,010

METHOD OF MANUFACTURING A RADIATION RECEIVER

FIELD AND BACKGROUND OF THE INVENTION

The present invention relates in general to radiation receivers and in particular to a new and useful method and apparatus for manufacturing such radiation receivers.

Radiation receivers and specifically infrared detectors are known which are made up of a two-part Dewar-type vessel or flask. The sensor elements of the detector are located in the Dewar space wherefrom leads to the outside are provided. In a prior art method of manufacturing, the leads are embodied as thin wires which are secured to the surface of the inner part of the Dewar vessel and extend to the outside while passing through a fusion zone between the two parts of the Dewar vessel. See for example U.S. Pat. No. 3,719,990 to Long et al.

The manufacture of such prior art radiation receivers becomes particularly difficult if a great number of sensor elements and a correspondingly great number of leads is needed.

SUMMARY OF THE INVENTION

The present invention is directed to a method of manufacturing a radiation receiver which permits the provision in a simple way, of a great number of leads, even if the walls of an inner part of the Dewar flask are angled.

A great advantage of the inventive method is that very thin and very narrowly spaced conductor tracks can be produced on the inner part of the Dewar type vessel, even if the surfaces of such a part are not flat.

Accordingly, an object of the present invention is to provide a method of manufacturing a radiation receiver which includes a plurality of sensor elements which are carried, with electrical leads connected thereto, to the outer surface of an inner cup-shaped member made of insulating material and forming the inner portion of a Dewar vessel comprising applying a metallic conductor layer on the outer surface of the member and forming a pattern of conductor tracks from the metallic layer using a laser beam.

A further object of the present invention is to provide an apparatus for manufacturing such a radiation receiver which includes a laser beam, means for supporting the member and means for moving the laser beam axially across the member to divide the metal layer into conductor tracks.

A further object of the present invention is to provide an apparatus for manufacturing a radiation receiver which is simple in design, rugged in construction and economical to manufacture.

The various features of novelty which characterize the invention are pointed out with particularity in the claims annexed to and forming a part of this disclosure. For a better understanding of the invention, its operating advantages and spcific objects attained by its uses, reference is made to the accompanying drawings and descriptive matter in which a preferred embodiment of the invention is illustrated.

DESCRIPTION OF THE PREFERRED EMBODIMENT

Figure 3:
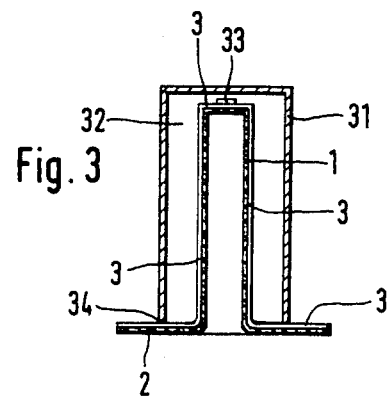
FIG. 3 is a diagrammatical sectional view of a radiation receiver manufactured in accordance with the invention.

Refering to the drawings in particular the inner part 1 of Dewar type vessel forming the radiation receiver is cup-shaped and comprises a flange portion 2, a bottom portion 4 and a cylindrical portion 1. Bottom portion 4 carries sensor elements 33 which are contacted from the outside through conductor tracks 3 which also extend on the annular flange portion 2 where their external portions form terminal contact sections. Another cup-shaped part 31 is tightly connected to flange portion 2 at 34, as shown in FIG. 3, so that a Dewar space 32 is formed which is vacuum tight and which encloses sensor elements 33. The sensor elements may be cooled by means of a device inserted in the cavity of part 1.

The leads are embodied as stratified conductor tracks 3 which are provided on the outer surface of inner part 1. Conductor tracks 3 are produced, in accordance with the invention, by depositing on the surface of part 1, especially also on flange portion 2 and, if provided, on bottom portion 4, a continuous single or multi- ply metallic layer, and sectioning this layer by means of a laser beam 6 to a pattern of conductor tracks 3. The metallic layer can be applied by any known means. Such as vapor deposition and can for example be gold. Also three-ply metallic tracks can be formed by first applying a chromium layer to the inner part surface, the applying one of a copper or titanium layer and finally applying a precious metal layer such as gold.

Figure 1:
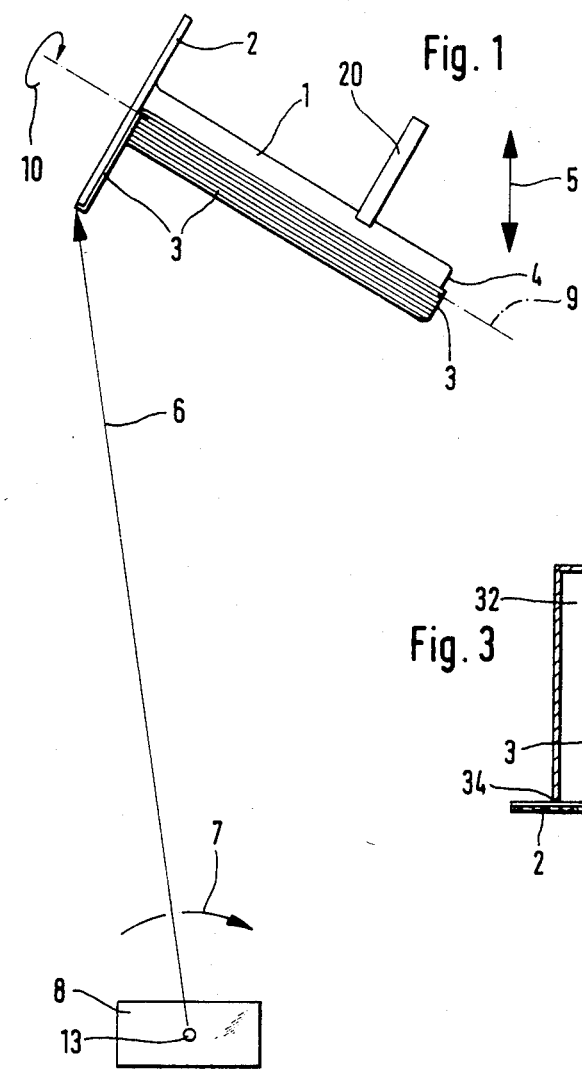
FIGS. 1 and 2 illustrative views of a preferred embodiment of a device for carrying out the inventive method.
Figure 2:
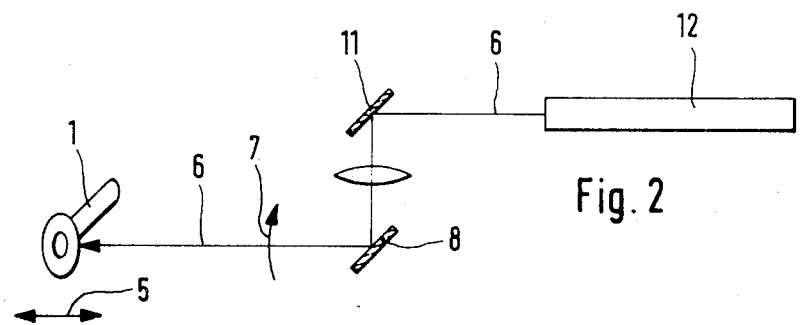

This sectioning to a conductor pattern is advantageously performed by a device such as shown in FIGS. 1 and 2. A laser 12 produces laser beam 6 which is initially deflected at a fixed mirror 11 and falls through optic means on a rotatable or pivotal mirror 8. The optic means are shown as a lens in FIG. 2. In FIG. 1, mirror 8 is shown as rotatable about an axis 13 which is perpendicular to the drawing plane. Such a rotation deflects laser beam 6 in the drawing plane in the direction of the arrow 7, and the point of incidence of the beam on part 1 "write" a line extending along the flange portion, the cylindrical portion and, if provided, also the bottom portion 4. To hold the focal point of the laser beam in the predetermined plane, it is advantageous to move the inner part 1', clamped in a suitable support, back and forth in the direction of the double arrow 5. This insures that the laser beam strikes the inner part always by a portion of minimum cross section for the beam.

The support of part or member 1 is achieved by suitably provided means schematically shown at 20. The movements required of member 1 as well as mirror 8 are established by suitably provided means shown schematically by arrows 5,7 and 10.

After the laser beam has scanned inner part 1 along the line thus determined, inner part 1 is turned in the direction of arrow 10 through a certain angle about its longitudinal axis 9, and laser beam 6 is moved along the next path. The predetermined paths advantageously coincide with the zones in which the initially applied large-surface metallic layer is to be removed, i,e. the laser beam follows the insulating gaps. To this end, inner part 1 is made of an insulant, of a ceramic material or, preferably, glass.

The sectioning of the metallic layer into a pattern may be effected by a more powerful laser beam for directly removing the respective portions of the metallic layer.

It is advisable, however, to apply a photoresist layer onto the large-surface metallic layer, which photoresist layer is exposed to the laser beam and becomes, at the exposed locations, either soluble or insoluble with respect to a certain solvent. Upon the exposure to the laser beam, the respective portions of the photoresist layer are removed by developing the photoresist layer. Then, the exposed portions of the metallic layer are etched out by dipping in a bath, or by spray etching, whereby the desired conductor tracks are obtained.

While a specific embodiment of the invention has been shown and described in detail to illustrate the application of the principles of the invention, it will be understood that the invention may be embodied otherwise without departing from such principles.

What is claimed is:

1. A method of manufacturing a radiation receiver having a cup-shaped part with an outer surface and a plurality of sensor elements with respective electrical leads on the outer surface, comprising:
    applying a metallic layer to at least a portion of the outer surface of the cup-shaped part;
    generating a laser beam;
    focusing the laser beam onto the outer surface of the cup-shaped part; and
    deflecting the laser beam along the cup-shaped part to establish a pattern of conductor tracks from the metallic layer which form the electrical leads.

2. A method according to claim 1, wherein the cup-shaped part includes an outwardly extending flange, including applying the metallic layer so as to extend onto a surface of the flange and deflecting the laser beam to extend the pattern of conductor tracks across the at least one surface of the flange.

3. A method according to claim 2, wherein the radiation receiver includes a Dewar vessel having an inner part formed of the cup-shaped part and an outer part forming a vacuum chamber with the inner part, including connecting the outer part to the inner part at a vacuum tight seal which extends across the pattern of conductor tracks on the at least one surface of the flange.

4. A method according to claim 1, including directing a laser beam onto the outer surface of the cup-shaped part using a mirror and deflecting the laser beam by rotating the mirror.

5. A method according to claim 2, wherein the cup-shaped part with its flange is symmetrical about an axis, including deflecting the laser beam linearly in a direction parallel to the axis to form a line of the pattern of conductor tracks axially along the cup-shaped part and flange, rotating the cup-shaped part about its axis and deflecting the laser beam linearly in a direction parallel to the axis again to form an additional line in the patter of conductor tracks with one conductor track formed between the lines.

6. A method according to claim 1, including generating the laser beam to have sufficient intensity to cut the metal layer with deflection of the laser beam to form the pattern of conductor tracks.

7. A method according to claim 1, including applying a photoresist layer onto the metallic layer, the photoresist layer being exposed to the laser beam as it is deflected on the surface of the cup-shaped part, removing one of the exposed and unexposed photoresist layer by developing, and etching the metallic layer to form the pattern of conductor tracks.

8. A method according to claim 1, wherein the conductor tracks have a three ply metallic structure including first applying a chromium layer to the outer surface of the cup-shaped part, thereafter applying one of a copper and titanium layer to the chromium layer and thereafter applying a precious metal layer over the one of the copper and titanium layer.

9. A method according to claim 8, wherein the precious metal layer is gold.

* * * * *